United States Patent
Baumgartner et al.

(10) Patent No.: US 8,201,117 B2
(45) Date of Patent: Jun. 12, 2012

(54) METHOD FOR SCALABLE DERIVATION OF AN IMPLICATION-BASED REACHABLE STATE SET OVERAPPROXIMATION

(75) Inventors: Jason R. Baumgartner, Austin, TX (US); Michael L. Case, Pflugerville, TX (US); Geert Janssen, Putnam County, NY (US); Hari Mony, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 645 days.

(21) Appl. No.: 12/357,907

(22) Filed: Jan. 22, 2009

(65) Prior Publication Data

US 2010/0185993 A1    Jul. 22, 2010

(51) Int. Cl.
G06F 17/50    (2006.01)
G06F 9/455    (2006.01)

(52) U.S. Cl. ........................................... 716/107
(58) Field of Classification Search .............. 716/107
See application file for complete search history.

(56) References Cited

U.S. PATENT DOCUMENTS

| | | | |
|---|---|---|---|
| 5,377,201 A | 12/1994 | Chakradhar et al. | |
| 6,035,107 A * | 3/2000 | Kuehlmann et al. | 716/103 |
| 6,321,173 B1 * | 11/2001 | Foster | 702/109 |
| 6,473,881 B1 * | 10/2002 | Lehner et al. | 716/107 |
| 6,691,286 B1 * | 2/2004 | McElvain et al. | 716/103 |
| 6,728,939 B2 * | 4/2004 | Johannsen | 716/103 |
| 7,086,016 B2 * | 8/2006 | Matsuzaki et al. | 716/107 |
| 7,136,899 B1 * | 11/2006 | Campailla | 709/206 |
| 7,246,331 B2 | 7/2007 | Ward | |
| 7,246,334 B1 * | 7/2007 | Dastidar et al. | 716/106 |
| 7,802,211 B2 * | 9/2010 | Horeth et al. | 716/103 |
| 2002/0144211 A1 * | 10/2002 | Maamari et al. | 714/811 |
| 2005/0192789 A1 | 9/2005 | Yang | |
| 2007/0005534 A1 | 1/2007 | Sabato et al. | |

OTHER PUBLICATIONS

Kunz, W et al. "Logic Optimization and Equivalence Checking by Implication Analysis" IEEE Transa. on Computer-Aided Design of Integrated Circuits and System, Mar. 1997, vol. 16, Issue 3 pp. 266-281.*

Roditty, L et al. "Improved Dynamic Reachability Algorithm for Directed Graphs" 43$^{rd}$ Annual IEEE Symposium on Foundations of Computer Science, FOCS'02, 2002, pp. 679-688.*

(Continued)

*Primary Examiner* — Stacy Whitmore
*Assistant Examiner* — Magid Dimyan
(74) *Attorney, Agent, or Firm* — Yudell Isidore Ng Russell PLLC (57) ABSTRACT

A method, system and computer program product for integrating implication-based analysis and equivalent gate analysis to maintain transitive reduction in an implication graph over a sequence of graph operations. One or more gates of a design are identified that are equivalent in all reachable states. Equivalent gates are assigned to an equivalence class when all gates within the equivalence class are equal. During the implication-based analysis the system determines when one or more implication paths are associated with the one or more equivalence classes, and an implication is generated at the implication path associated with the equivalence classes. A transitively reduced graph is received depicting the implications and equivalence classes of the design. When one or more operations are assigned to the transitively reduced graph, the graph is automatically adjusted to maintain transitive reduction.

20 Claims, 5 Drawing Sheets

OTHER PUBLICATIONS

Tafertshofer, P et al. "SAT based ATPG using Fast Justification and Propagation in the Implication Graph" 1999 IEEE/ACM International Conference on Computer-Aided Design, 1999, pp. 139-146.*

Tafertshoifer, P et al. "A SAT-Based Implication Engine for Efficient ATPG, Equivalence Checking, and Optimization of Netlist" 1997 IEEE/ACM International Conference on Computer-Aided Design, 1997, pp. 648-655.*

Aiguo Xie and Peter A. Beerel, Implicit Enumeration of Strongly Connected Components, IEEE, 1999, University of Southern California, Department of Electrical Engineering—Systems, Los Angeles, CA.

Allen Van Gelder, Toward Leaner Binary-Clause Reasoning in a Satisfiability Solver, Mar. 11, 2003, pp. 1-12, Computer Science Dept., SOE, University of California, Santa Cruz, CA 95064.

Per Bjesse and Koen Claessen, SAT-Basd Verification without State Space Traversal, FMCAD 2000, 2000, pp. 372-389, Berlin, Germany.

J. Van Leeuwen, Graph Algorithms, Rijksuniversiteit Utrecht Vakgroep Informatica, Oct. 1986, pp. 2-15, RUU-CS-86-17, Telefroon, The Netherlands.

Michael L. Case et al, Inductivellly Finding a Reachable State Space Over-Approximation, Department of EECS, University of California, Berkeley, 2006.

Michael L. Case and Robert K. Brayton, Mantaining a Minimum Equivalent Graph on The Presence of Graph Connectivity Changes, Department of EECS, University of California, Berkeley, Technical Report 2007.

* cited by examiner

FIG. 5

METHOD FOR SCALABLE DERIVATION OF AN IMPLICATION-BASED REACHABLE STATE SET OVERAPPROXIMATION

BACKGROUND

1. Technical Field

The present invention generally relates to verification techniques and in particular to verification techniques of digital integrated circuit designs.

2. Description of the Related Art

Digital design verification (where design verification is a way to verify that an integrated circuit (IC) design is correct) is a computationally expensive process; which generally requires resources that are exponential with respect to the size of the design under verification. Many prior art digital design verification algorithms rely on reachability analysis. Reachability analysis requires enumerating the reachable states (i.e. searching outward from the initial states in order to determine the set of states that are reachable) of the design under test to assess whether the design conforms to the required specification(s), which is a size-limited process. Reachable state set computation is at the core of many automatic formal verification techniques. However, current methods for the computation of reachable state set overapproximation are lossy (i.e. information pertaining to state reachability is lost since a state lying in an approximately reachable state set does not imply that the state is reachable), thereby including one or more states that are not reachable.

Multiple methods have been proposed for performing digital design verification that compute reachable state set overapproximation to avoid the computational complexity of precise reachable state computations. For example, a method has been developed for computing reachable state set overapproximation by deriving implication relationships between pairs of gates in a digital design. Although implication analysis generates tight reachability overapproximations, the main challenge for implication analysis is scalability. Implication derivation is more expensive for larger scale designs due to the number of candidate implication checks. The candidate implication checks are quadratic in the number of nodes required for the graph associated with the implication derivation; thereby resulting in expensive analysis. Methods have been proposed to represent the candidate implications in an implication graph and use transitive reduction to simplify the graph representation. The use of the implication graph has the advantage of enabling a large reduction in the number of candidate implication checks; however, the algorithms required for maintaining the transitive reduction of implication graphs are not cost effective.

SUMMARY OF ILLUSTRATIVE EMBODIMENTS

Disclosed are a method, a system and a computer program product for integrating implication-based analysis and equivalent gate analysis to maintain transitive reduction in an implication graph over a sequence of graph operations. One or more gates of a design are identified that are equivalent in all reachable states. Equivalent gates are assigned to an equivalence class when all gates within the equivalence class are equal. During the implication-based analysis the system determines when one or more implication paths are associated with the one or more equivalence classes, and an implication is generated at the implication path associated with the equivalence classes. A transitively reduced graph is received depicting the implications and equivalence classes of the design. When one or more operations are assigned to the transitively reduced graph, the graph is automatically adjusted to maintain transitive reduction.

BRIEF DESCRIPTION OF THE DRAWINGS

The invention itself, as well as advantages thereof, will best be understood by reference to the following detailed description of an illustrative embodiment when read in conjunction with the accompanying drawings, wherein.

DETAILED DESCRIPTION OF AN ILLUSTRATIVE EMBODIMENT

The illustrative embodiments provide a method, system and computer program product for integrating implication-based analysis and equivalent gate analysis to maintain transitive reduction in an implication graph over a sequence of graph operations. One or more gates of a design are identified that are equivalent in all reachable states. Equivalent gates are assigned to an equivalence class when all gates within the equivalence class are equal. During the implication-based analysis the system determines when one or more implication paths are associated with the one or more equivalence classes, and an implication is generated at the implication path associated with the equivalence classes. A transitively reduced graph is received depicting the implications and equivalence classes of the design. When one or more operations are assigned to the transitively reduced graph, the graph is automatically adjusted to maintain transitive reduction.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

Within the descriptions of the figures, similar elements are provided similar names and reference numerals as those of the previous figure(s). Where a later figure utilizes the element in a different context or with different functionality, the element is provided a different leading numeral representative of the figure number. The specific numerals assigned to the elements are provided solely to aid in the description and not meant to imply any limitations (structural or functional or otherwise) on the described embodiment.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that terms is utilized. Specifically, as utilized herein, the term candidate refers to an implication prior to the completion of a proof, wherein a candidate becomes an invariant when the candidate is proven to hold for all reachable design states. The term edge is utilized interchangeably with implication and implication path, whereby an edge, or implication, depicts an association between one or more equivalence classes.

Figure 1:
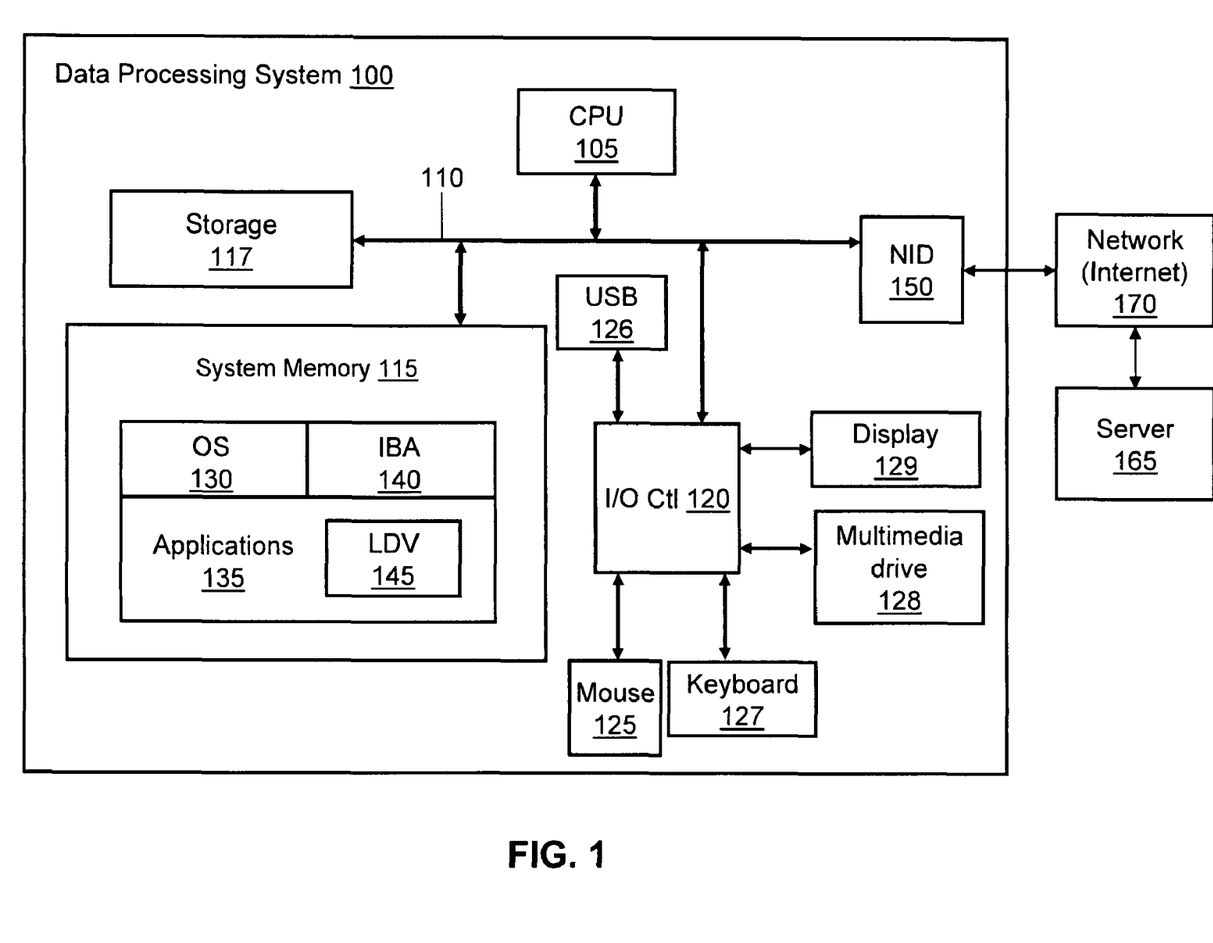
FIG. 1 is a block diagram of a data processing system, within which various features of the invention may advantageously be implemented, according to one embodiment of the invention.

With reference now to the figures, and beginning with FIG. 1, there is depicted a block diagram representation of an example data processing system (DPS), as utilized within one embodiment. DPS may be a computer, a portable device, such as a personal digital assistant (PDA), a smart phone, and/or other types of electronic devices that may generally be considered processing devices. As illustrated, DPS 100 comprises at least one processor or central processing unit (CPU) 105 connected to system memory 115 via system interconnect/bus 110. Also connected to system bus 110 is Input/output (I/O) controller 120, which provides connectivity and control for input devices, of which pointing device (or mouse) 125 and keyboard 127 are illustrated. I/O controller 120 also provides connectivity and control for output devices, of which display 129 is illustrated. Additionally, a multimedia drive 128 (e.g., compact disk read/write (CDRW) or digital video disk (DVD) drive) and USB (universal serial bus) port 126 are illustrated, coupled to I/O controller 120. Multimedia drive 128 and USB port 126 enable insertion of a removable storage device (e.g., optical disk or thumb drive) on which data/instructions/code may be stored and/or from which data/instructions/code may be retrieved. DPS 100 also comprises storage 117, within/from which data/instructions/code may also be stored/retrieved.

DPS 100 is also illustrated with a network interface device (NID) 150, by which DPS 100 may connect to one or more access/external networks 170, of which the Internet is provided as one example. NID 150 may be configured to operate via wired/or wireless connection to an access point of the network. Network 170 may be an external network such as the Internet or wide area network (WAN), or an internal network such as an Ethernet (local area network—LAN) or a Virtual Private Network (VPN). Connection to the external network 150 may be established with one or more servers 165, which may also provide data/instructions/code for execution on DPS 100, in one embodiment.

In addition to the above described hardware components of DPS 100, various features of the invention are completed/supported via software (or firmware) code or logic stored within system memory 115 or other storage (e.g., storage 117) and executed by CPU 105. Thus, for example, illustrated within system memory 115 are a number of software/firmware/logic components, including operating system (OS) 130 (e.g., Microsoft Windows®, a trademark of Microsoft Corp, or GNU®/Linux®, registered trademarks of the Free Software Foundation and The Linux Mark Institute), applications 135, logic design verification (LDV) 145, and implication based analysis (IBA) utility 140 (which executes on CPU 105 to provide implication based analysis logic). In actual implementation, IBA utility 140 may be combined with or incorporated within application 135 to provide a single executable component, collectively providing the various functions of each individual software component when the corresponding combined code is executed by the CPU 105. For simplicity, IBA utility 140 is illustrated and described as a stand alone or separate software/firmware component, which provides specific functions, as described below.

In one embodiment, servers 165 includes a software deploying server, and DPS 100 communicates with the software deploying server (165) via network (e.g., Internet 170) using network interface device 150. Then, the IBA utility 140 may be deployed from/on the network, via software deploying servers 165. With this configuration, software deploying server performs all of the functions associated with the execution of IBA utility 140. Accordingly, DPS 100 is not required to utilize internal computing resources of DPS 100 to execute IBA utility 140.

CPU 105 executes IBA utility 140 as well as OS 130, which supports the user interface features of IBA utility 140. Certain functions supported and/or implemented by IBA utility 140 generate processing logic executed by processor and/or device hardware to complete the implementation of that function. For simplicity of the description, the collective body of code that enables these various features is referred to herein as IBA utility 140. Among the software code/instructions/logic provided by IBA utility 140, and which are specific to the invention, are: (a) code/logic for identifying one or more gates in a design that are equivalent in all reachable states, wherein the one or more identified gates are equivalent gates; (b) code/logic for assigning equivalent gates to an equivalence class when all gates within the equivalence class are equal; and (c) code/logic for determining when one or more implication paths are associated with one or more equivalence classes; and code/logic for generating an implication for the one or more equivalence classes. According to the illustrative embodiment, when CPU 105 executes IBA utility 140, DPS 100 initiates a series of functional processes that enable the above functional features as well as additional features/functionality. These features/functionality are described in greater detail below within the description of FIGS. 2-5.

Those of ordinary skill in the art will appreciate that the hardware components and basic configuration depicted in FIG. 1 may vary. The illustrative components within DPS 100 are not intended to be exhaustive, but rather are representative to highlight essential components that are utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, an IBM eServer pSeries system, a product of International Business Machines Corporation in Armonk, N.Y., running the Advanced Interactive Executive (AIX) operating system or LINUX operating system.

Figure 2:
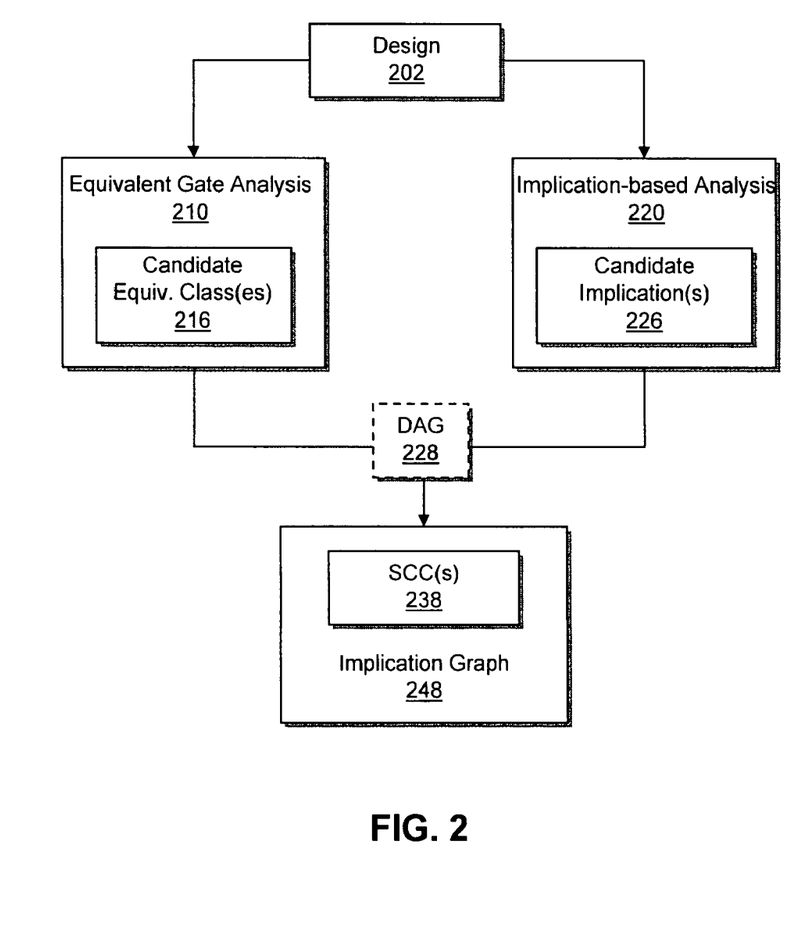
FIG. 2 is a block diagram depicting the operations for computing equivalences and implications in implication-based reachability overapproximation, in accordance with one embodiment of the invention.

With reference now to FIG. 2, there is depicted a block diagram for computing equivalences and implications in implication-based reachability overapproximation. FIG. 2 comprises design 202, whereby design 202 is evaluated utilizing equivalent gate analysis 210 and implication-based analysis 220. Directed acyclic graph DAG 228 decomposes into strongly connected components (SCCs) 238. SCCs 238 are nodes within implication graph 248. Equivalent gate analysis 210 includes candidate equivalence classes 216, and implication-based analysis 220 includes candidate implications 226. IBA utility (FIG. 1, 140) controls the operations of equivalent gate analysis 210 and implication-based analysis 220.

In one embodiment, implication graph 248 comprises one or more SCCs 238. SCCs 238 is a set of nodes such that for any two nodes, for example A and B, there is a direct path from A to B and also a direct path from B to A. With reference to an implication graph (generated by IBA utility 140), such as implication graph 248, the path from A to B means that A implies B. Similarly, the existence of a path from B to A means that B implies A; therefore, logically A=B. Within implication graph 248, SCC(s) 238 is an equivalence class of gates (also described as nodes), or a set of gates that are all equivalent (relative to each pair of nodes within the equivalence class).

In implication-based reachability overapproximation, there are a large number of candidate (Boolean) implications (226) with respect to the number of gates in the design (202). In one embodiment, implication-based analysis 220 reduces the size of the set of candidate implications 226 utilizing transitive reduction. Candidate implication(s) 226 are organized within implication graph 248. Implication graph 248 includes one or more nodes: A, B, and C, for example, whereby A implies B (A=>B), B implies C (B=>C), and A implies C (A=>C). Implication-based analysis 220 induces an edge (directed edge) from A to B. Candidate implications 226 are transitive, therefore given that A implies B, and B implies C (B=>C), then A implies C (A=>C). When A=>B and B=>C are identified in the graph the A=>C is redundant information. Transitive reduction, within implication-based analysis 220, identifies and removes all redundant edges, such as A=>C.

In one embodiment, implication graph 248 is generated after one or more SCC(s) 238 are identified. Equivalence gate analysis 210 is combined with implication-based analysis 220. When equivalent gate analysis 210 is executed a check determines whether one or more gates of candidate equivalent class(es) 216 are equal. An association is made between SCC(s) 238 and candidate equivalence class(es) 216. SCC(s) 238, of implication graph 248, are represented with an associated (single representative) node from candidate equivalence class 216. Implication graph 238 becomes an acyclic (condensed) graph when SCC 238 is replaced with the associated node from candidate equivalence class 216.

In another embodiment, implication derivation is performed utilizing a "hybrid" approach, whereby the hybrid approach computes both equivalences and implications of design 202. When equivalent gate analysis 210 is combined with implication-based analysis 220, a check for implications between representatives of equivalence classes is executed. Candidate equivalence classes 216 are separated from candidate implications 226, and checks for candidate implications 226 are stored in implication graph 248. The resulting implication graph (248) is an acyclic (condensed graph).

In one embodiment, transitive reduction is maintained in an implication graph during implication-based analysis. The resources involved in checking and validating implications are reduced when implication-based analysis 220 is combined with equivalent gate analysis 210. Candidate implications 226 are automatically separated from candidate equivalence class(es) 216. DAG 228 is utilized to store candidate implication(s) 226. When candidate implication(s) 226 are stored in DAG 228, candidate implication(s) 226 are checked in association with the candidate equivalence class(es) 216. Candidate implication(s) 226 and candidate equivalence class(es) 216 are simultaneously checked when candidate implication(s) 226 and candidate equivalence class(es) 216 are stored in DAG 228. Thereby, the length of algorithms utilized to maintain transitive reduction of implication graph 248 is significantly reduced when candidate implication(s) 226 are stored in DAG 228. Transitive reduction of implication graph 248 is maintained.

In another embodiment, the size of implication graph 248 is further reduced. Implication based analysis 210 determines when one or more of candidate implications 226 do not "tighten" the reachability overapproximation. For example, when one or more candidate implication(s) 226 are a tautology (i.e. the implication(s) are true in all states), the implication (or candidate implication) has no impact on tightening the reachability overapproximation; thereby the information is eligible to simplify the implication graph. Implication-based analysis 220 executes a semantic analysis on the design 202 to determine when one or more candidate implication(s) 226 are tautologies. When a tautology is detected within candidate implications 226, the one or more candidate implications are removed from implication graph 248. Thereby the size of implication graph 248 is significantly reduced, and the speed of the analysis utilized to maintain the transitive reduction of implication graph 248 is increased.

In another embodiment, ternary analysis is utilized with logic simulation to determine when an implication check is a tautology. An implication check from equivalence class A to equivalence class B is determined when A is made equivalent (driven) to a constant one, and all inputs are made equivalent (driven) to 'X'. If equivalence class B evaluates to a constant one, then the implication is a tautology.

Figure 3:
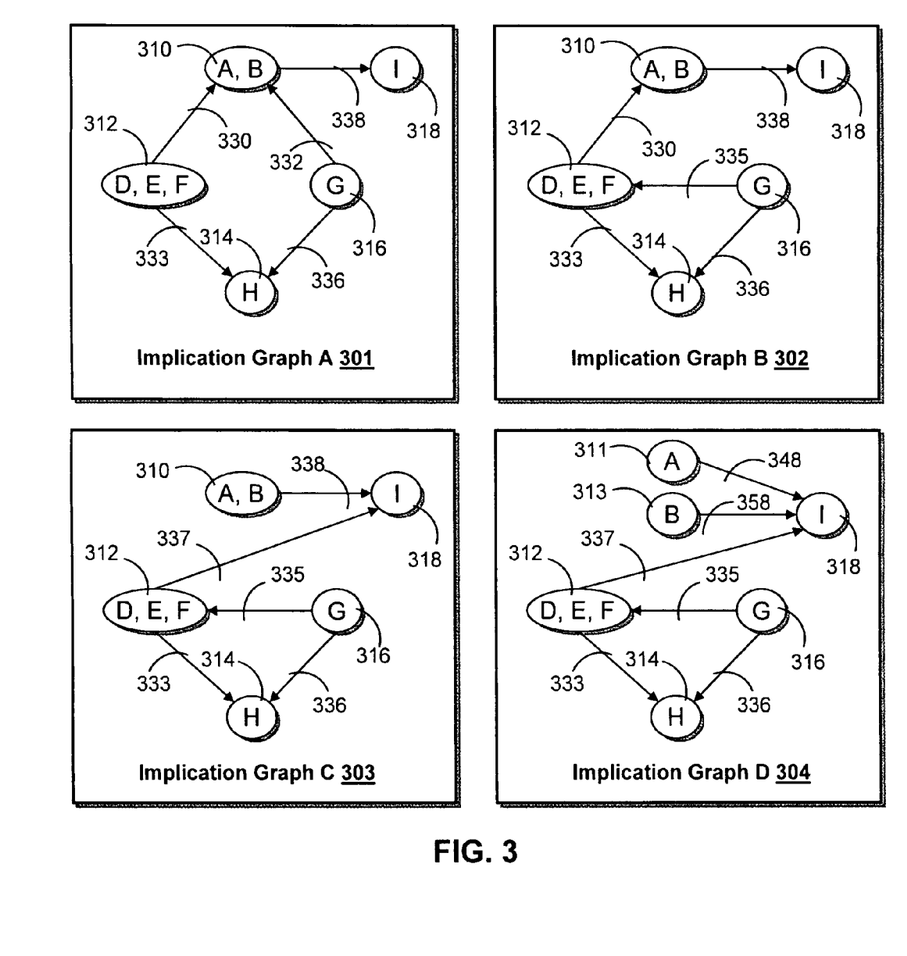
FIG. 3 is a schematic diagram illustrating activities of an implication graph over a set of equivalence classes, according to one embodiment of the invention.

FIG. 3 illustrates activities of an implication graph over a set of equivalence classes. FIG. 3 comprises implication graph A 301, implication graph B 302, implication graph C 303, and implication graph D 304. Implication graph A 301, implication graph B 302, implication graph C 303, and implication graph D 304 include one or more of the following equivalence classes: equivalence class AB 310, equivalence class DEF 312, equivalence class H 314, equivalence class G 316, equivalence class I 318, equivalence class A 311, and equivalence class B 313. Implications, also known as edges, associate one or more equivalence classes within the implication graphs. The implications of FIG. 3 include: implication DB 330, implication GB 332, implication DH 333, implication GH 336, implication AI 338, implication GF 335, implication DI 337, implication SAI 348, and implication SBI 358.

In one embodiment, a large amount of data is represented in the compact structure of an implication graph. All pairs of nodes within an equivalence class are equivalent. Implication graph A 301 is a transitive reduction graph that illustrates five equivalence classes: equivalence class AB 310, equivalence class DEF 312, equivalence class H 314, equivalence class G 316, and equivalence class I 318, whereby A, B, D, E, F, H, G, and I are nodes. In equivalence class DEF 312, D=E, E=F, and D=F. Thus, an equivalence class with n nodes represents $n*(n-1)/2$ different equivalences.

In another embodiment, implications are utilized to associate one or more equivalence classes. An implication is assigned to a set of equivalence classes when the equivalence classes are equal. For example, when any of the nodes D, E, and F within equivalence class DEF 312 equals one, then all nodes A and B of equivalence class AB 310 are also equal to one. Therefore D, E, and F is associated with A and B via implication DB 330.

In one embodiment, an implication is added to implication graph A 301 resulting in a subsequent transitive reduction graph, implication graph B 302. Implication GF 335 is added within implication graph B 302, enabling equivalence class G 316 to imply equivalence class DEF 312. Implication GB 332 becomes redundant when implication GF 335 is added, therefore implication GB 332 is removed to preserve the transitive reduction. Adding implication GF 335 increases the information content within implication graph B 302 without increasing the number of implications (i.e. edges) in the transitive reduction. The resulting implication graph (302) has increased information while maintaining transitive reduction status.

In one embodiment, an implication is removed from the transitive reduction graph, implication graph B 302, resulting in implication graph C 303 (also a transitive reduction graph). Implication DB 330 is removed, thereby removing the reachability between equivalence class DEF 312 and equivalence class AB 310. To preserve the reachability between equivalence class DEF 312 and equivalence class AB 310, implication DI 337 is added directly from equivalence class DEF 312 to equivalence class I 318. Implication DI 337 is an implicit edge that is "virtually" present, however not shown because displaying implication DB 330 and implication DI 337 is redundant. Removing implication DB 330 makes implication DI 337 irredundant, therefore implication DI 337 is explicitly depicted within implication graph C 303. The information content within implication graph C 303 is increased without increasing the implications (edges) of the implication graph.

In another embodiment, an equivalence class is removed from the transitive reduction graph (implication graph C 303). An example of this activity is when IBA utility (140 of FIG. 1) learns node A of equivalence class AB is not equal to node B. Equivalence class AB 310 is refined into two classes: equivalence class A 311 and equivalence class B 313. The number of nodes within implication graph D 304 increases due to the number of equivalence classes increasing. Implications within implication graph D 304 are increased so that the set of equivalence classes that equivalence class A 311 and equivalence class B 313 are associated with are identical to the set of equivalence classes associated with equivalence class AB 310. Although equivalence class AB is removed, implication graph D 304 maintains transitive reduction status.

Figure 4:
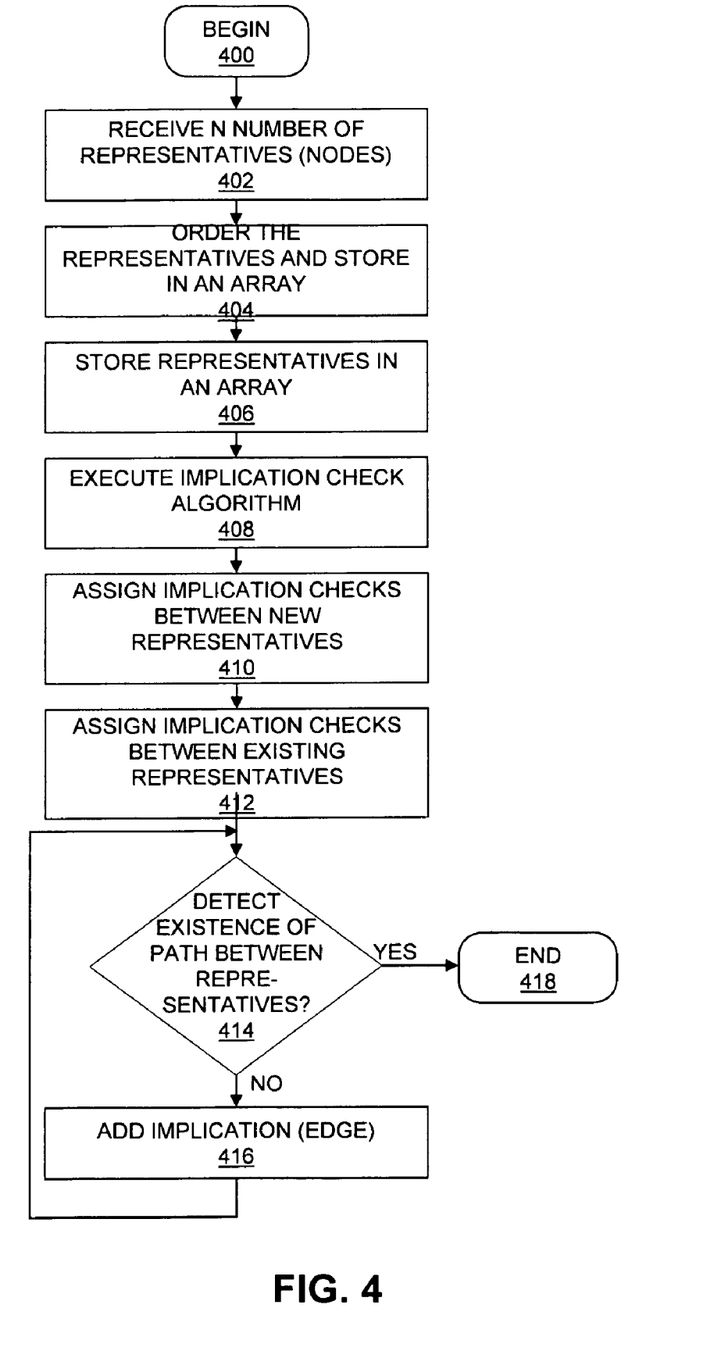
FIG. 4 is a flow chart illustrating the method for maintaining transitive reduction after transitively reduced edge addition, in accordance with one embodiment of the invention.
Figure 5:
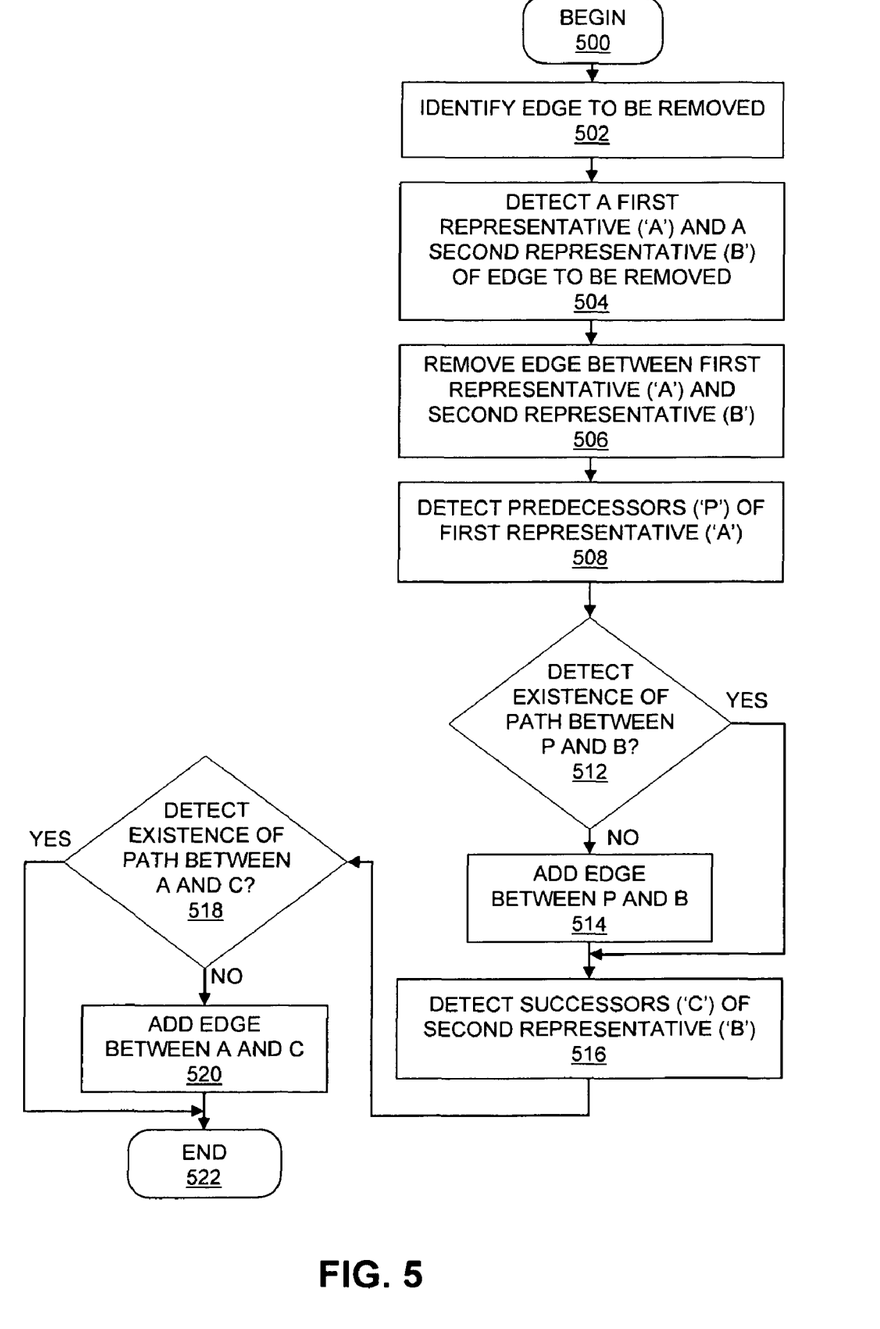
FIG. 5 is a flow chart illustrating the method for maintaining transitive reduction after transitively reduced edge removal, according to one embodiment of the invention.

FIGS. 4-5 are flow charts illustrating various methods by which the above processes of the illustrative embodiments are completed. Although the methods illustrated in FIGS. 4-5 may be described with reference to components shown in FIGS. 1-3, it should be understood that this is merely for convenience and alternative components and/or configurations thereof can be employed when implementing the various methods. Key portions of the methods may be completed by IBA utility 140 executing on processor 105 within DPS 100 (FIG. 1) and controlling specific operations on DPS 100, and the methods are thus described from the perspective of both IBA utility 140 and DPS 100.

FIG. 4 depicts the process for performing transitively reduced edge addition. The process of FIG. 4 begins at initiator block 400 and proceeds to block 402, at which n number of representatives (or nodes) are received, whereby the representatives are representatives of one or more equivalence classes. The representatives are classified in an order that associates equivalent nodes with an equivalence class, at block 404. At block 406 the representatives are stored in an array. An implication check algorithm is executed, at block 408, which determines (checks) the status of implications.

Implication checks are assigned between new representatives, at block 410. At block 412 implication checks are assigned between existing representatives. An example of an implication check new and old representatives includes A, B, and C as the ordered set of existing representatives and D, E, and F as the ordered set of new representatives. Implication checks are first added for E and F, D and E, and D and F. Then implication checks are added for C and D, C and E, C and F, followed by D and D, B and E, B and F, then finally A and D, A and E, and A and F (in the order presented). Adding implications (edges) based on the order of representatives, and checking for existing implication paths before addition of the implication (edge) ensures that the resultant graph is transitively reduced. All implication checks for a given representative are added simultaneously to avoid redundant algorithms.

A determination is made, at block 414, whether implication path(s) are detected between the one or more representatives (new and/or existing). If the one or more implication path(s) between the associated equivalence classes are detected, the process ends at block 418. If the one or more implication paths are not detected for the associated equivalence classes, the process continues to block 416. At block 416 an implication (edge) is added between the equivalence classes. The process returns to block 414.

The flowchart of FIG. 5 depicts the method for performing transitively reduced edge removal. The process of FIG. 5 begins at initiator block 500, and proceeds to block 502 where the edge (implication) to be removed is identified. At block 504 the first representative 'A' (equivalence class) and second representative 'B' (equivalence class) associated with the edge to be removed are detected. The edge between the first representative 'A' and the second representative 'B' is removed at block 506. The predecessors 'P' of the first representative are detected, at 508, whereby the predecessors 'P' are one or more equivalence classes (or representatives) previously associated with the first representative 'A'.

A decision is made, at block 512, whether an implication path exists between the predecessors 'P' and the second representative 'B'. If an implication path exists between predecessors 'P' and second representative 'B', the process continues to block 516. If an implication path does not exist between predecessors 'P' and second representative 'B', the process continues to block 514. At block 514 an edge is added between predecessors 'P' and second representative 'B'. The successors 'C' of the second representative 'B' are detected at block 516, whereby the successors are one or more equivalence classes associated with second representative 'B'.

At block 518 a decision is made whether an implication path exists between first representative 'A' and successor 'C'. If a path does not exists between first representative 'A' and successor 'C' the process continues to block 520. If a path does exists between first representative 'A' and successor 'C' the process ends. An edge is added between first representative 'A' and successor 'C' at block 520. The process ends at block 522.

In the flow charts above, one or more of the methods are embodied in a computer readable storage medium containing computer readable code such that a series of steps are performed when the computer readable code is executed (by a processing unit) on a computing device. In some implementations, certain processes of the methods are combined, performed simultaneously or in a different order, or perhaps omitted, without deviating from the spirit and scope of the invention. Thus, while the method processes are described and illustrated in a particular sequence, use of a specific sequence of processes is not meant to imply any limitations on the invention. Changes may be made with regards to the sequence of processes without departing from the spirit or scope of the present invention. Use of a particular sequence is therefore, not to be taken in a limiting sense, and the scope of the present invention extends to the appended claims and equivalents thereof.

As will be appreciated by one skilled in the art, the present invention may be embodied as a method, system, and/or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," "logic", or "system." Furthermore, the present invention may take the form of a computer program product on a computer-usable storage medium having computer-usable program code embodied in or on the medium.

As will be further appreciated, the processes in embodiments of the present invention may be implemented using any combination of software, firmware, microcode, or hardware. As a preparatory step to practicing the invention in software, the programming code (whether software or firmware) will typically be stored in one or more machine readable storage mediums such as fixed (hard) drives, diskettes, magnetic disks, optical disks, magnetic tape, semiconductor memories such as RAMs, ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The medium may be electronic, magnetic, optical, electromagnetic, infrared, or semiconductor system (or apparatus or device) or a propagation medium. Further, the medium may be any apparatus that may contain, store, communicate, propagate, or transport the program for use by or in connection with the execution system, apparatus, or device. The methods of the invention may be practiced by combining one or more machine-readable storage devices containing the code according to the described embodiment(s) with appropriate processing hardware to execute the code contained therein. An apparatus for practicing the invention could be one or more processing devices and storage systems containing or having network access (via servers) to program(s) coded in accordance with the invention. In general, the term computer, computer system, or data processing system can be broadly defined to encompass any device having a processor (or processing unit) which executes instructions/code from a memory medium.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution. By way of example, a non exclusive list of types of media, includes recordable type (tangible) media such as floppy disks, thumb drives, hard disk drives, CD ROMs, DVDs, and transmission type media such as digital and analogue communication links.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A computer implemented method for integrating implication-based analysis and equivalent gate analysis to maintain transitive reduction in an implication graph over a sequence of graph operations during a circuit design implemented by the computer, said method comprising:
   identifying one or more gates in the circuit design that are equivalent in all reachable states, wherein the one or more identified gates are equivalent gates;
   assigning equivalent gates to an equivalence class, wherein all gates within the equivalence class are equal;
   determining when one or more implication paths are associated with one or more equivalence classes; and
   the computer outputting a circuit design implication for the one or more equivalence classes.

2. The method of claim 1, further comprising:
   identifying one or more strongly connected components (SCCs) within the circuit design;
   generating an implication graph of the circuit design, wherein the implication graph is a transitive reduction graph;
   associating one or more SCC(s) with one or more equivalence classes; and
   outputting an acyclic graph when the implication graph is generated, wherein one or more SCC(s) are represented as a node in the acyclic graph.

3. The method of claim 1, further comprising:
   executing an implication check, wherein the implication check identifies the implication paths and redundant implications;
   determining when an implication is one of redundant and when an implication path exist with no implication;
   assigning one or more implication checks between one or more new equivalence classes;
   assigning one or more implication checks between existing equivalence classes; and
   dynamically adding the implication in response to the implication not being detected between equivalence classes with the implication path and when the implication is irredundant.

4. The method of claim 3, further comprising:
   automatically adjusting the implication graph to a transitive reduction graph in response to one or more operations being assigned to the implication graph, wherein the operations are one or more of:
      adding one or more implications to an implication graph;
      removing the implication from the implication graph; and
      removing an equivalence class from the implication graph.

5. The method of claim 4, further comprising:
   in response to adding one or more implications to the implication graph, removing one or more redundant implications;
   in response to removing one or more equivalence classes from the implication graph, adding one or more direct implications to preserve reachability between one or more equivalence classes; and outputting a subsequent transitive reduction graph, wherein the subsequent transitive reduction graph contains increased information and maintains a transitive reduction status.

6. The method of claim 4, further comprising:

in response to removing one or more implications from the implication graph, determining one or more of a predecessor and a successor of a first equivalence class and a second equivalence class associated with the one or more implications removed from the implication graph;

in response to the implication path existing with no implication between a first equivalence class and one of a predecessor and a successor, adding the implication between the first equivalence class and the predecessor or the successor; and in response to the implication path existing with no implication between a second equivalence class and one of a successor and a predecessor, adding an implication between the successor and the second equivalence class.

7. The method of claim 1, further comprising:

storing one or more implication checks in a directed acyclic graph (DAG); and detecting implications and equivalence classes in response to the implication being between the one or more equivalence classes, wherein the length of the implication based analysis algorithm is decreased in response to the implications and the equivalence classes being simultaneously detected.

8. The method of claim 1, further comprising:

executing a semantic analysis on the circuit design;

determining when one or more candidate implication(s) are a tautology; and in response to one or more tautologies being detected among the one or more implications, removing the one or more tautologies, wherein the transitive reduction of the implication graph is automatically increased when in response to removal of the one or more tautologies.

9. A computer system for maintaining transitive reduction in an implication graph, said computer system comprising:

a processor component; and a utility executing on the processor component and which comprises code that executes on the processor to cause the computer system to:

identify one or more gates in a circuit design that are equivalent in all reachable states, wherein the one or more identified gates are equivalent gates;

assign equivalent gates to an equivalence class, wherein all gates within the equivalence class are equal;

determine when one or more implication paths are associated with one or more equivalence classes; and output a circuit design implication for the one or more equivalence classes.

10. The computer system of claim 9, said utility further comprising code that causes the computer system to:

identify one or more strongly connected components (SCCs) within the circuit;

generate an implication graph of the design, wherein the implication graph is a transitive reduction graph;

associate one or more SCC(s) with one or more equivalence classes; and output an acyclic graph in response to generation of the implication graph, wherein one or more SCC(s) are represented as a node in the acyclic graph.

11. The computer system of claim 9, said utility further comprising code that causes the computer system to:

execute an implication check, wherein the implication check identifies the implication paths and redundant implications;

determine when the implication is one of redundant and when an implication path exist with no implication;

assign one or more implication checks between one or more new equivalence classes;

assign one or more implication checks between existing equivalence classes; and dynamically add the implication in response to the implication not being detected between equivalence classes with the implication path and in response to the implication not being redundant.

12. The computer system of claim 11, said utility further comprising code that causes the computer system to:

automatically adjust the implication graph to a transitive reduction graph in response to one or more operations being assigned to the implication graph, wherein the operations are one or more of:

adding one or more implications to the implication graph;

removing the implication from the implication graph; and removing the equivalence class from the implication graph.

13. The computer system of claim 12, said utility further comprising code that causes the computer system to:

in response to adding one or more implications to the implication graph, remove one or more redundant implications;

in response to removing one or more equivalence classes from the implication graph, add one or more direct implications to preserve reachability between one or more equivalence classes; and output a subsequent transitive reduction graph, wherein the subsequent transitive reduction graph contains increased information and maintains a transitive reduction status.

14. The computer system of claim 12, said utility further comprising code that causes the computer system to:

in response to one or more implications being removed from the implication graph, determining one or more of a predecessor and a successor of a first equivalence class and a second equivalence class associated with the one or more implications removed from the implication graph;

in response to the implication path existing with no implication between a first equivalence class and one of a predecessor and a successor, add the implication between the first equivalence class and the predecessor or the successor; and in response to the implication path existing with no implication between a second equivalence class and one of a successor and a predecessor, add the implication between the successor and the second equivalence class.

15. The computer system of claim 9, said utility further comprising code that causes the computer system to:

store one or more implication checks in a directed acyclic graph (DAG); and detect implications and equivalence classes in response to the implication being between the one or more equivalence classes, wherein the length of the implication based analysis algorithm is decreased in response to the implications and the equivalence classes being simultaneously detected.

16. The computer system of claim 9, said utility further comprising code that causes the computer system to:

execute a semantic analysis on the circuit design;
determine when one or more candidate implication(s) are a tautology; and
in response to detecting one or more tautologies among the one or more implications, removing the one or more tautologies, wherein the transitive reduction of the implication graph is automatically increased in response to removal of the one or more tautologies.

17. A computer program product comprising:
a computer readable device; and
program code on the computer readable device that when executed by a processor enables a machine to provide the functions of:
identifying one or more gates in a circuit design that are equivalent in all reachable states, wherein the one or more identified gates are equivalent gates;
assigning equivalent gates to an equivalence class, wherein all gates within the equivalence class are equal;
determining when one or more implication paths are associated with one or more equivalence classes;
outputting a circuit design implication for the one or more equivalence classes;
identifying one or more strongly connected components (SCCs) within the circuit design;
generating an implication graph of the circuit design, wherein the implication graph is a transitive reduction graph;
associating one or more SCC(s) with one or more equivalence classes;
outputting an acyclic graph in response to the implication graph not being generated, wherein one or more SCC(s) are represented as a node in the acyclic graph;
executing an implication check, wherein the implication check identifies implication paths and redundant implications;
determining when the implication is one of redundant and when an implication path exist with no implication;
assigning one or more implication checks between one or more new equivalence classes;
assigning one or more implication checks between existing equivalence classes; and
dynamically adding the implication in response to the implication not being detected between equivalence classes with the implication path and in response to the implication being irredundant.

18. The computer program product of claim 17, further comprising program code for:
automatically adjusting the implication graph to a transitive reduction graph in response to one or more operations being assigned to the implication graph, wherein the operations are one or more of:
adding one or more implications to an implication graph;
removing the implication from the implication graph; and
removing the equivalence class from the implication graph;
in response to the one or more implications being added to an implication graph, removing one or more redundant implications;
in response to one or more equivalence classes being removed from the implication graph, adding one or more direct implications to preserve reachability between one or more equivalence classes;
outputting a subsequent transitive reduction graph, wherein the subsequent transitive reduction graph contains increased information and maintains a transitive reduction status;
in response to one or more implications being removed from the implication graph, determining one or more of a predecessor and a successor of a first equivalence class and a second equivalence class associated with the one or more implications removed from the implication graph;
in response to the implication path existing with no implication between a first equivalence class and one of a predecessor and a successor, adding the implication between the first equivalence class and the predecessor or the successor; and
in response to the implication path existing with no implication between a second equivalence class and one of a successor and a predecessor, adding the implication between the successor and the second equivalence class.

19. The computer program product of claim 17, further comprising program code for:
storing one or more implication checks in a directed acyclic graph (DAG); and
detecting implications and equivalence classes in response to the implication being between the one or more equivalence classes, wherein the length of the implication based analysis algorithm is decreased in response to implications and equivalence classes being simultaneously detected.

20. The computer program product of claim 17, further comprising program code for:
executing a semantic analysis on the circuit design;
determining when one or more candidate implication(s) are a tautology; and
in response to one or more tautologies being detected among the one or more implications, removing the one or more tautologies, wherein the transitive reduction of the implication graph is automatically increased in response to the one or more tautologies being removed.

* * * * *